United States Patent
Tran

(10) Patent No.: US 10,971,245 B1
(45) Date of Patent: Apr. 6, 2021

(54) MEASUREMENT OF MTJ IN A COMPACT MEMORY ARRAY

(71) Applicant: Spin Memory, Inc., Fremont, CA (US)

(72) Inventor: Minh Quang Tran, San Jose, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/577,839

(22) Filed: Sep. 20, 2019

(51) Int. Cl.
| | |
|---|---|
| *G11C 11/16* | (2006.01) |
| *G11C 29/50* | (2006.01) |
| *H01L 27/22* | (2006.01) |
| *H01F 10/32* | (2006.01) |
| *H01L 43/02* | (2006.01) |

(52) U.S. Cl.
CPC ...... *G11C 29/50004* (2013.01); *G11C 11/161* (2013.01); *G11C 11/1673* (2013.01); *G11C 11/1697* (2013.01); *H01L 27/222* (2013.01); *G11C 2029/5004* (2013.01); *H01F 10/329* (2013.01); *H01F 10/3254* (2013.01); *H01F 10/3286* (2013.01); *H01L 43/02* (2013.01)

(58) Field of Classification Search
CPC ............ G11C 29/50004; G11C 11/161; G11C 11/1697; G11C 11/1673; H01L 27/222; H01F 10/3286
See application file for complete search history.

(56) References Cited

U.S. PATENT DOCUMENTS

| | | | |
|---|---|---|---|
| 6,927,569 B2 | 8/2005 | Worledge et al. | |
| 9,691,462 B2* | 6/2017 | Jung | G11C 7/12 |
| 10,741,232 B1* | 8/2020 | Jabeur | G11C 11/1673 |
| 2010/0188894 A1* | 7/2010 | Rao | G11C 11/1653 365/171 |
| 2012/0086476 A1* | 4/2012 | Yuh | G05F 3/26 327/108 |
| 2014/0003124 A1* | 1/2014 | Youn | G11C 11/1693 365/148 |
| 2016/0260466 A1* | 9/2016 | Katayama | G11C 11/1673 |
| 2017/0062032 A1* | 3/2017 | Seo | G11C 11/1673 |
| 2019/0088299 A1* | 3/2019 | Antonyan | H01L 27/228 |
| 2019/0304527 A1* | 10/2019 | Kim | H01L 43/08 |

OTHER PUBLICATIONS

Worledge et al., "Magnetoresistance measurement of unpatterned magnetic tunnel junction wafers by current-in-plane tunneling," Applied Physics Letters vol. 83, Jul. 7, 2003, pp. 84-86.

* cited by examiner

*Primary Examiner* — Mushfique Siddique
(74) *Attorney, Agent, or Firm* — Zilka-Kotab, P.C.

(57) ABSTRACT

A system and method for testing a magnetic memory cell in a bit cell array to determine whether the electrical resistance values of the memory cell are within acceptable parameters. The system and method allows for the determination of the electrical resistance of the memory cell without parasitic resistance associated with that memory cell in order to accurately determine the electrical resistance of the memory cell.

16 Claims, 8 Drawing Sheets

MEASUREMENT OF MTJ IN A COMPACT MEMORY ARRAY

FIELD OF THE INVENTION

The present invention relates to magnetic random-access memory (MRAM) and more particularly to a method for measuring magnetic tunnel junction performance in a compact magnetic random-access memory array.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

The MRAM cells in an array on a chip can be connected by metal word and bit lines. Each memory cell is connected to one of these word lines and bit lines. Each word line connects a row of cells, and each bit line connects columns of cells. Circuitry such as CMOS structures can provide a selection transistor which is electrically connected to the MTJ stack through the top or bottom metal contacts. The direction of the current flow is between top and bottom metal electrode contacts.

Reading the state of the cell is achieved by detecting whether the electrical resistance of the cell is in the high or low resistance state. Writing to the cells requires a sufficiently high DC current flowing in the direction through the MTJ stack between the top and bottom metal electrode contacts to induce a spin transfer torque that orients (switches) the free layer into the desired direction. The amount of current needed to write to a cell is higher than the current that flows through the cell during the read process, so that a read operation does not change the state of the cell.

The resistance area product (RA) and tunnel magnetoresistance (TMR) qualities of the MTJ critically affect the performance of the MRAM memory array. The ability to characterize these properties (RA, TMR) during fabrication and even during operation is important for quality control and for determining the memory state of MTJ MRAM elements. A method that is preferably non-destructive is desired for obtaining timely feedback in the design/research process and for monitoring of fabrication process after the MTJ pillars have been defined by masking and etching. Worledge et al. have described a method for measuring magnetoresistance (MR) and resistance area product (RA) of un-patterned magnetic tunnel junction film stacks. The RA is measured by making a series of four-point probe resistance measurements on the surface of an un-patterned wafer at various probe tip spacings. The probe tips are spaced apart on the order of microns for typical applications. The MR is obtained by repeating the measurement while applying different magnetic fields. (Worledge et al.; Magnetoresistance measurement of un-patterned magnetic tunnel junction wafers by current-in-plane tunneling, Applied Physics Letters, Vol. 83, No. 1, 7 Jul. 2003, pp. 84-86; and U.S. Pat. No. 6,927,569.)

Commercially available automated metrology tools (e.g. from CAPRES), which are designed for measuring selected magnetic parameters of un-patterned MTJ film stacks, use multi-point probes with probe tip spacings in the micron range. Four and twelve-point probes are available for these automated metrology tools. As an example, a CAPRES twelve-point probe is used with a 12 by 14 multiplexor (MUX) to select a total of 495 different pin-configurations each with different probe spacings (pitch). This approach allows the selected tests to be performed with different probe spacings without having to have the tips be movable with respect to each other. Existing automated metrology tools also provide means for applying a selected magnetic field to the test sample.

SUMMARY

The present invention provides a magnetic memory device that includes a magnetic bit cell array including a first plurality of magnetic tunnel junction elements, and a reference bit cell array including a second plurality of magnetic tunnel junction elements. The device further includes circuitry connected with the bit cell array and the reference bit cell array. The circuitry is configured to read a signal from the bit cell array to determine an electrical resistance associated with the first magnetic tunnel junction element that is one of the first plurality of magnetic tunnel junction elements, and read a signal from the reference bit cell array to determine an electrical resistance associated with a second magnetic tunnel junction element that is one of the second plurality of magnetic tunnel junction elements. The circuitry is further configured to provide for the determination of a parasitic resistance associated with the first magnetic tunnel junction element in order to determine an electrical resistance associated with the first magnetic tunnel junction element without parasitic resistance, and compare that resistance value with a reference resistance value.

The testing of a memory cell can be performed by a method that includes providing a bit cell array, a reference bit cell array and circuitry connected with the bit cell array and reference bit cell array. The circuitry is configured in a first configuration, and a reading process is performed with the circuitry in the first configuration to read a current and voltage separately from each of the bit cell array and the reference bit cell array to determine an electrical resistance associated with the particular memory cell of the bit cell array and a corresponding memory cell of the reference bit cell array. The method further includes configuring the circuitry in a second configuration, and performing a second reading process with the circuitry in the second configuration to read a combined current and voltage from the bit cell array and the reference bit cell array, the circuitry being configured to include an electrical resistance from a reference resistor. A parasitic resistance value associated with the particular memory cell of the bit cell array is then determined based on the results of the first and second reading, and an electrical resistance of the particular memory cell excluding the parasitic resistance is determined.

The system and method allows the electrical resistance of a particular memory cell to be accurately determined excluding the parasitic resistance of associated circuitry such as from word lines, bit lines and transistor selectors. Since parasitic resistance can be large compared with the resistance of a memory cell, the exclusion of the parasitic resistance provides a great improvement in the accuracy memory cell resistance testing.

These and other features and advantages of the invention will be apparent upon reading the following detailed description of the embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
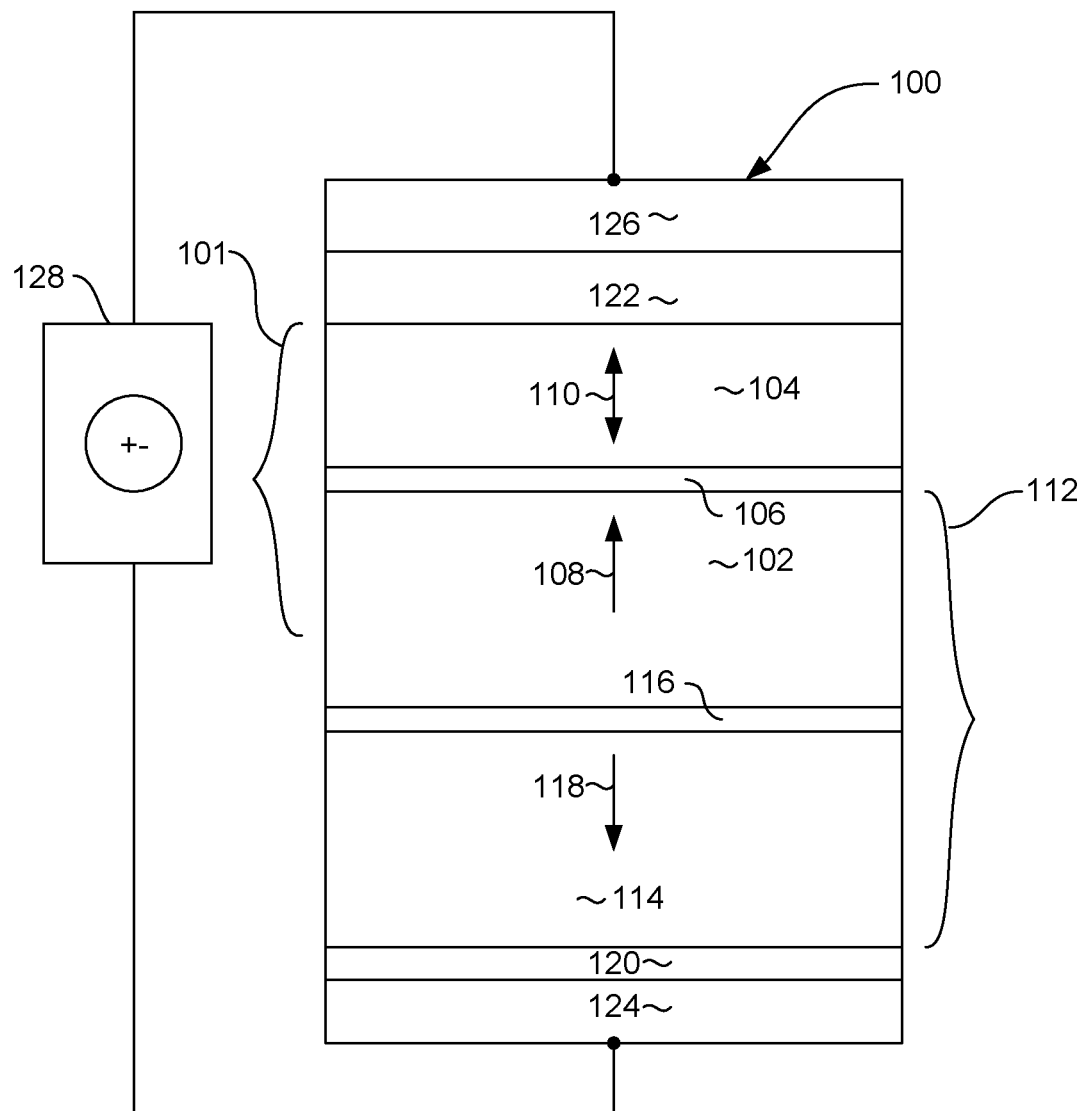
FIG. 1 is a schematic, cross sectional view of a perpendicular magnetic tunnel junction (pMTJ) element.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 121 may be provided near the top of the memory element 100 to protect the underlying layers during manufacture, such as during high temperature annealing and from exposure to ambient atmosphere. The capping layer 121 can be constructed of, for example, Ta. In addition, a Ru hard mask layer 122 is formed at the top of the memory element 100 over the capping layer 121. Optionally, the Ru layer 122 can serve as both a hard mask layer and as a capping layer 121, eliminating the need for a separate capping layer 122. The use of Ru provides several advantages over other hard mask materials layer materials. For example, the Ru hard mask layer 122 does not form an electrically insulating oxide, and therefore remains a good electrical conductor even after various processing steps that would oxidize other hard mask materials. Therefore, the Ru hard mask 122 can remain in the finished memory element 100 without imparting any parasitic resistance. In addition, Ru has a high resistance to removal by ion beam etching (also known as ion milling). This advantageously allows the hard mask layer to be thinner, which in turn allows for lower spacing of memory elements and increased data density. These advantages of such a Ru capping layer 122 will be more readily appreciated with regard to various methods of manufacturing magnetic memory elements as described in greater detail herein below.

In addition, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

In order to read data recorded to memory elements of a magnetic random access memory system, the system must be able to distinguish whether each of the memory elements is in a high or low resistance state. This can be accomplished by applying a voltage across the memory element and then detecting the resulting amount of electrical current flowing through the memory element. This electrical current is compared with a reference value in order to determine whether the electrical current is above or below this reference value. If the current is above the reference value, then the memory element is in a low resistance state (read as a "1"). Conversely, if the electrical current is less than the reference value, then the memory element is in a high resistance state (read as a "0").

However, the resistance values of a memory element can vary as a result of several factors. For example, the high and low resistance values of a magnetic memory element can vary with temperature and can vary as a result of manufacturing variations and variations related to the memory element's location in an array or on the wafer on which it was manufactured. Therefore, in order to accurately determine the memory state of a memory element, it is desirable to periodically determine the reference voltage in a manner that takes into account variations in the actual memory state of the memory element.

Figure 2:
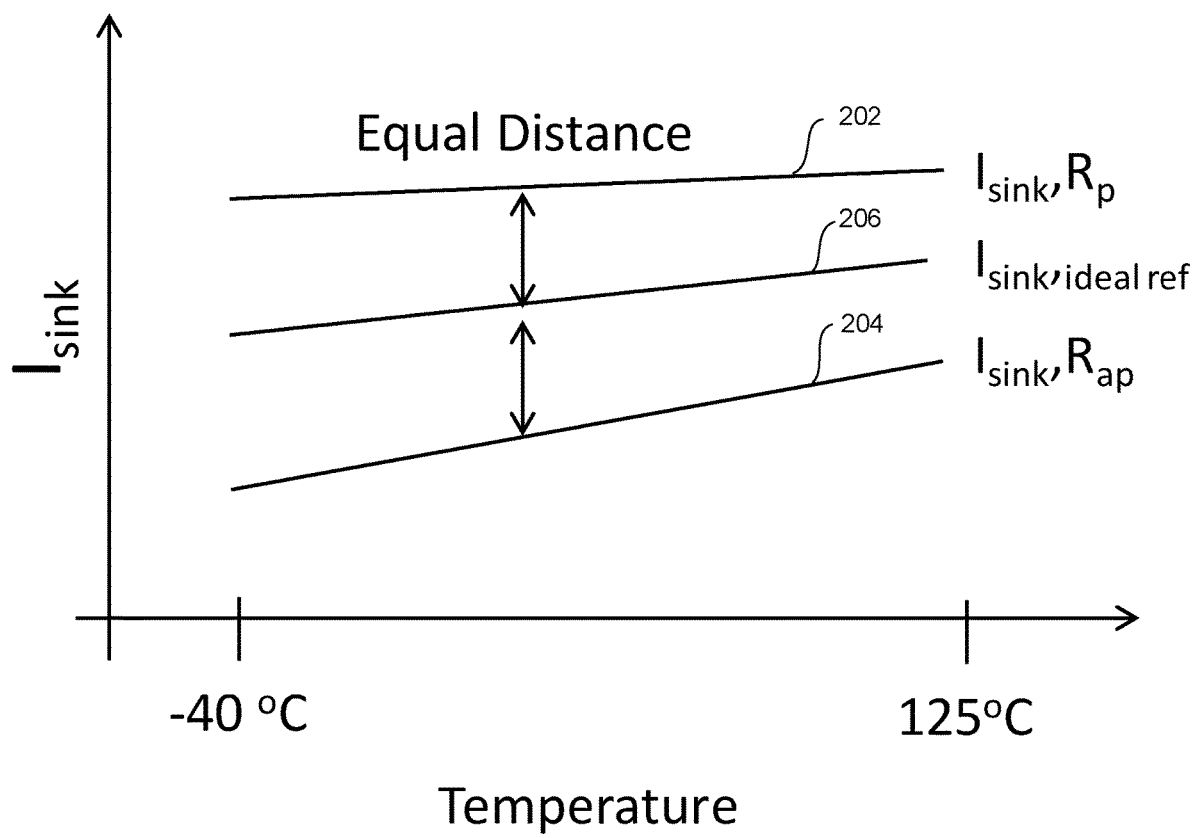
FIG. 2. is a graph illustrating the relationship between sink current and temperature for a perpendicular magnetic tunnel junction (pMTJ) memory element for a high resistance state, a low resistance state and a reference state.

FIG. 2 is a graph illustrating how current (Isink) through a pMTJ memory element varies with temperature. Line 202 shows the current through the memory element for a low resistance state (i.e. when the magnetic free layer and magnetic reference layer are magnetized in the same direction (Rp)). Line 204 shows the current through the memory element as a function of temperature for the memory element in the high resistance state (i.e. when the magnetic free layer is magnetized opposite to the magnetic reference layer (Rap)). As can be seen, the current in the low resistance state (line 202) and the current in the high resistance state (line 204) both increase substantially linearly with temperature. Line 206 shows the reference current value. The reference current 206 is ideally located equidistant between the low resistance state 202 and high resistance state 204. As can be seen, then, the reference current also increases substantially linearly with temperature. This temperature dependence of the reference current 206 is by way of example. As discussed above, other factors can affect a variation in the reference current value, such as manufacturing variation or location of the memory element within a memory array. Therefore, it is desirable to periodically or continuously determine the actual reference current value in order to read the magnetic state of a memory element in a magnetic memory array. In addition, it is desirable to compare the high and low resistance states of MTJ memory elements within a memory array during manufacture in order to perform quality control to determine whether the MTJ memory elements in an array meet desired performance parameters.

Figure 3:
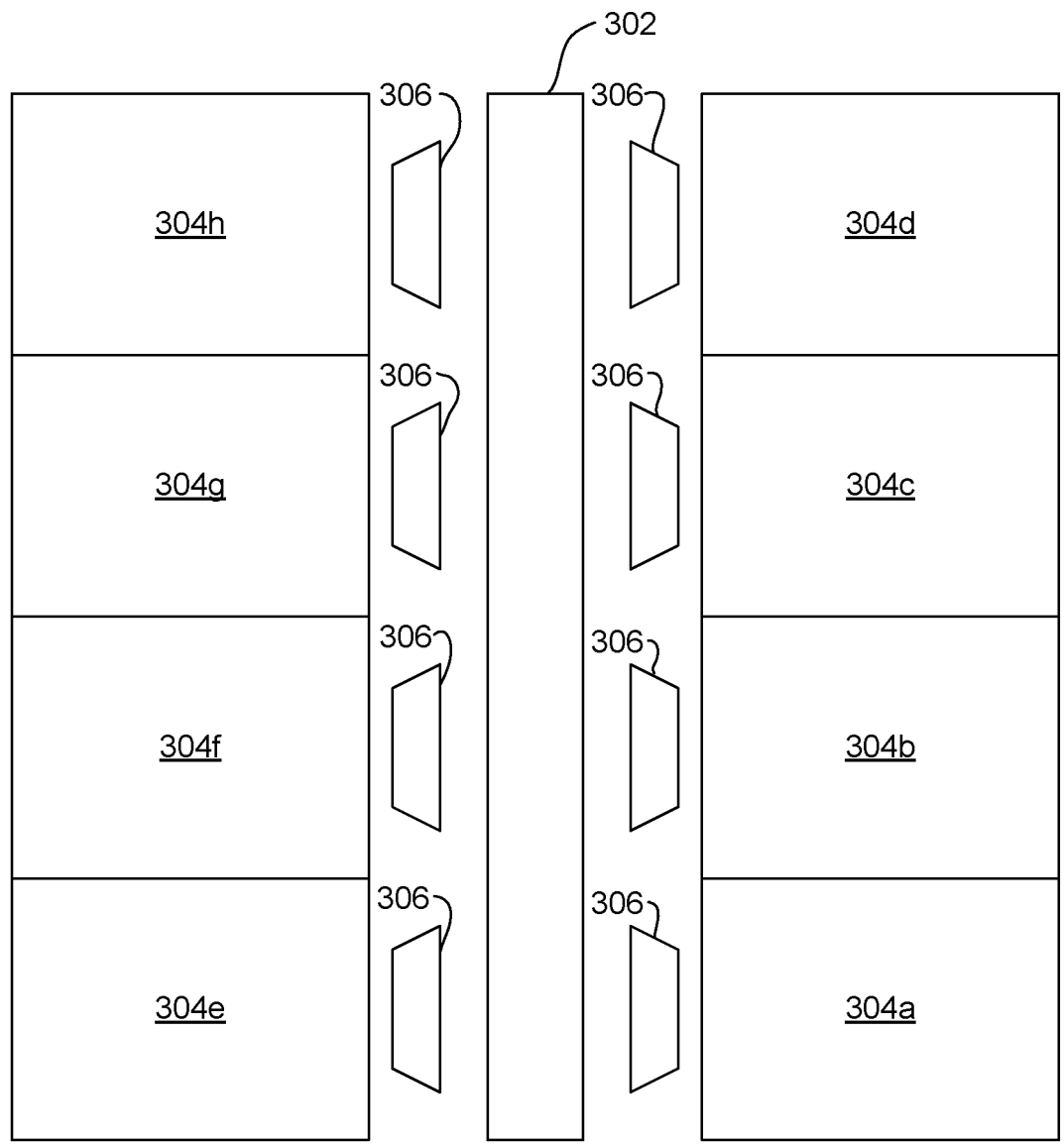
FIG. 3 is a schematic illustration of a memory input output (IO) structure having multiple memory arrays.

FIG. 3 is a schematic illustration of an input/output (TO) structure of a magnetic memory array. The IO structure includes SA biasing circuitry 302 for driving a series of memory arrays 304a-h, which can be arranged in a mirror image fashion at opposite sides of the biasing circuitry 302. Each of the memory arrays 304 can be electrically connected with a multiplexer 306, which selects signals from one or more memory elements of the associated memory array 304 and delivers these signals between the associated memory array 304 and the circuitry 302.

Figure 4:
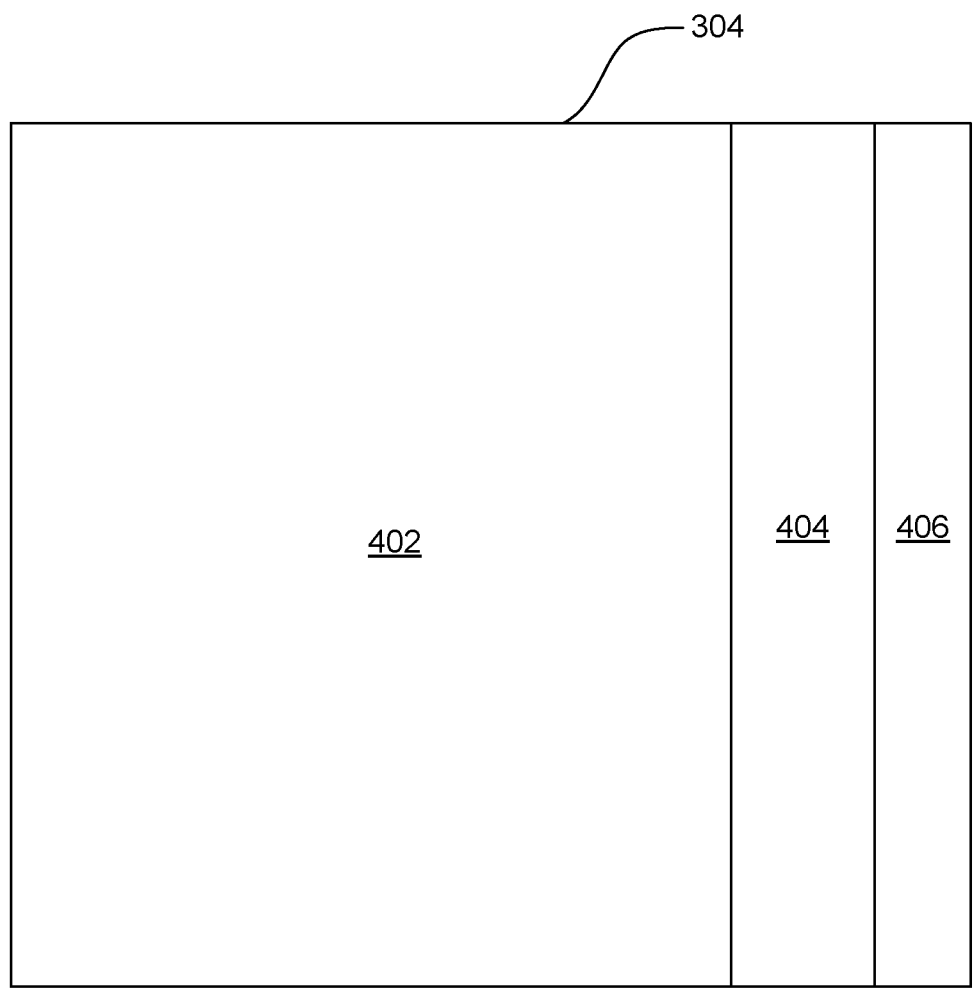
FIG. 4 is an enlarged, schematic view of a memory array of the IO structure of FIG. 3.

FIG. 4 shows an enlarged view of one of the memory element arrays 304 of FIG. 3. The memory element array 304 can include an array 402 of memory columns that include data memory elements used for storing and reading data. The memory element portion 402 may make up a majority of the array 304. The array 304 also includes an array of reference columns 404 which can be controlled by a reference driver 406. An example of reference cells in the reference array 404 according to an embodiment will be described in greater detail herein below. As can be seen with reference to FIGS. 3 and 4, each of the memory arrays 304 as shown in FIG. 3 can include a reference cell array 404 and reference driver 406 as well as an array 402 of memory elements. Also, as shown in FIG. 3, these memory arrays 304 can be arranged as mirror images across the circuitry 302. Therefore, a reference current signal can be read from a memory array (e.g. 304a) while reading a data signal from an opposite memory array (e.g. 304e), in order to accurately read a data signal (e.g. from memory array 304e).

Figure 5:
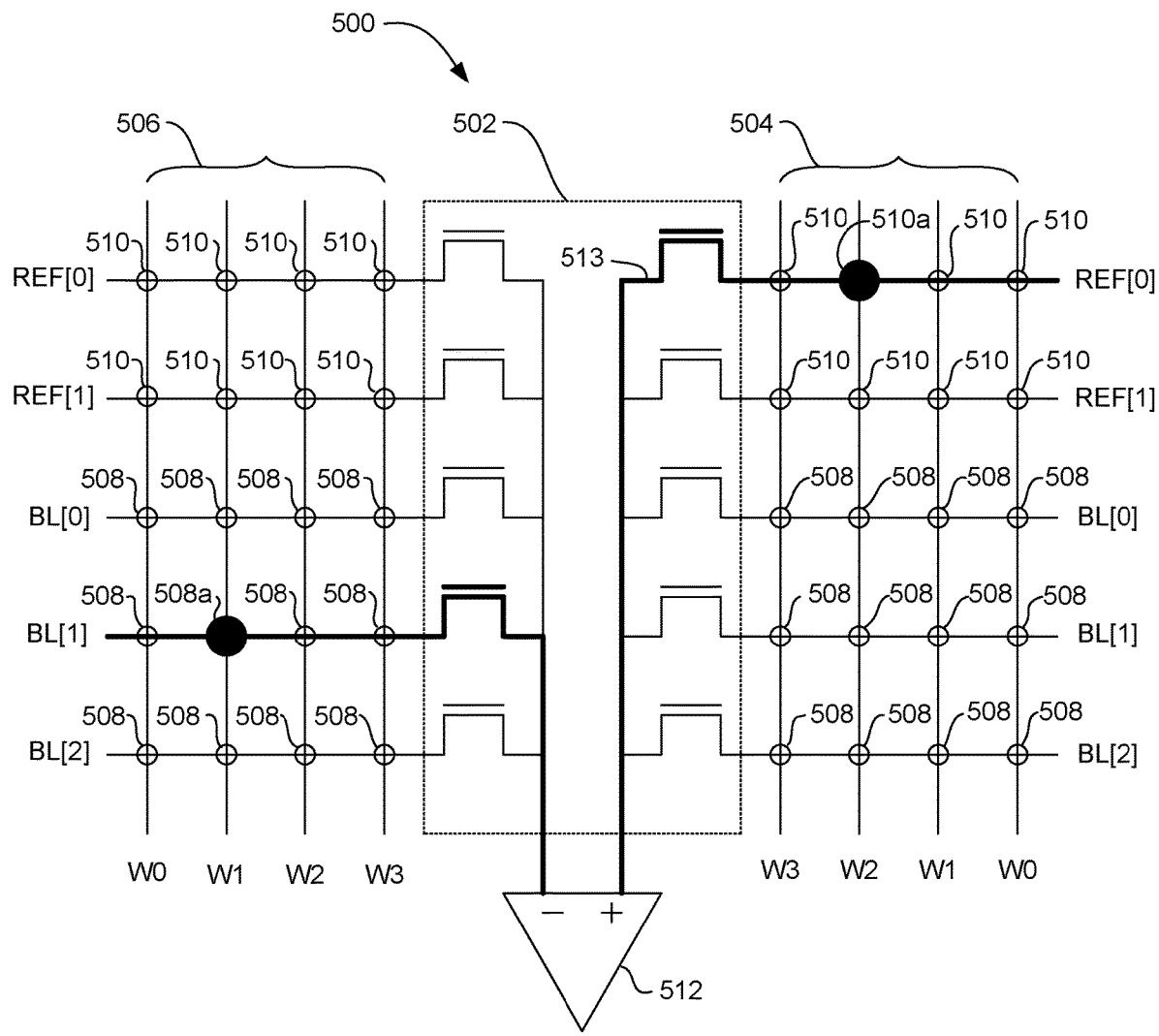
FIG. 5 is a schematic illustration of an IO array with a reference cell structure for calibrating a reference current for reading data.

FIG. 5 is a schematic illustration of sensing circuitry 500. The circuitry 500 can include a sensing block 502. Memory arrays 504, 506 are formed at either side of the sensing block 502, and may be symmetrically arranged at either side of the sensing block 502. Each of the arrays 504, 506 can correspond to the arrays 304 of FIGS. 3 and 4. Each array 504, 506 includes reference lines REF[0], REF[1], and bit lines BL[0], BL[1], BL[2], and also includes a series of word lines W0, W1, W2, W3. The number of reference lines, bit lines and word lines in FIG. 5 is by way of example only, and many more or even fewer reference lines, bit lines and word lines could be included in each array 504, 506. A magnetic memory cell 508 is associated with the junction of each bit line with a word line. Similarly, a reference cell 510 is associated with the junction of each reference line with a word line.

Each of the arrays 504, 506 is connected with a comparator 512, through the sensing block 502 so that a signal from one array (e.g. 504) can be compared with a signal from the opposite array (e.g. 506). Each reference cell 510 (a structure for which will be further described herein below) is configured to produce a reference current. As discussed above with reference to FIG. 2, the reference current signal is a signal that is at a halfway point between a high resistance state and a low resistance state of a memory cell 508 of the array. A reference current signal can be read from a selected reference cell (510a) to determine a reference current value. This reference signal is passed to the comparator 512 through a circuit indicated by bold line 513. In addition, a read signal can be read from a memory cell 508a and passed to the comparator 512. Desirably, the reference cell 510a from which the reference signal is read is in the array (e.g. 504) that is opposite the array (e.g. 506) in which the memory cell 508a is located. The comparator 512 receives the signal from the memory cell 508a and compares this signal to the reference signal from the reference element 510a to determine whether the memory cell 508a is in a high or low resistance state (e.g. 0 or 1).

The comparison of an MTJ memory element resistance against a reference resistance can be made by comparing the resistance against a reference MTJ resistance as described above, but can also be made by comparing the MTJ resistance against a reference resistor that can be a structure similar to the functional MTJ but which does not have to be connected with control circuitry necessary for the functional MTJ array. MTJ measurement processes can also include comparing measured MTJ resistance against a look-up table of known, desired reference resistances. However, there have been challenges with accurately measuring MTJ resistance. For example, the reference resistance value of the reference MTJ or resistor can vary by plus or minus 15-20 percent. As discussed above, this can be due to manufacturing variations, location of the MTJ within an array or can vary with temperature. In addition, current mirror issues with regard to circuitry for measuring and comparing MTJ and reference resistances can cause a large spread in reference resistance values.

Another challenge to accurately measuring MTJ resistance comes from large parasitic resistance values in the circuitry associated with writing to and reading from the MTJ. The MTJ memory elements in an array are connected with rows of bit lines and columns of word lines. Many MTJ memory elements can be connected with a single bit line, and similarly many MTJ memory elements can be electrically connected with a single word line. A source line can be used to provide voltage to the memory element to switch the magnetic state of the memory element, and the word line can be used to provide a gate voltage activate a transistor such as a CMOS transistor to apply a voltage from the source line to a desired MTJ memory element. However, all of these elements (e.g. bit line, word line, source line, and CMOS transistors) provide a significant amount of parasitic resistance, and the amount of parasitic resistance depends upon the location of a given MTJ memory element within the memory array.

Figure 6:
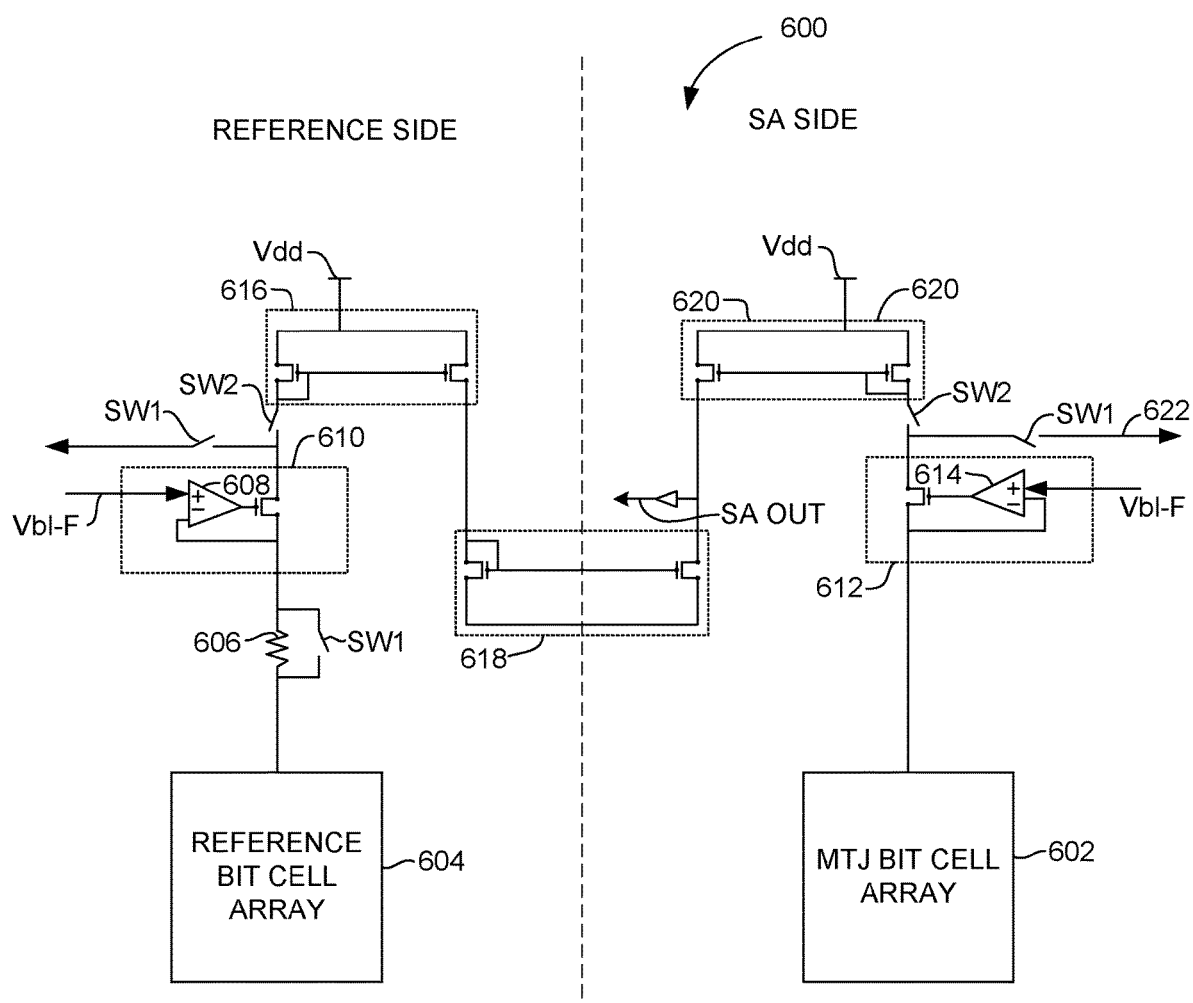
FIG. 6 is a schematic diagram of circuitry for accurately measuring MTJ resistance while eliminating parasitic resistance errors.

FIG. 6 shows a schematic illustration of a circuitry 600 that can be used to measure MTJ resistance that can subtract out any parasitic resistance contribution for the calculation of actual MTJ resistance. The circuitry 600 includes an MTJ bit cell array 602, that is a functional array of magnetic MRAM memory elements. The circuitry 600 also includes a reference bit cell array 604. The reference bit cell array 604 is configured to include circuitry and memory cells arranged similar to, the same as, or a mirror image of the circuitry and memory cells of the MTJ bit cell array 602. In order to check an individual memory cell of the functional MTJ array 602, the individual bit cell within the functional bit cell array 602 is read in high and low resistance states. This resistance of the memory cell of interest is compared with a reference resistance, which can be provided by reading the electrical resistance across a reference resistor 606 included in the reference side of the circuitry 600. However, as stated above, reading the resistance of the memory cell of interest in the MTJ cell array 602 also includes significant parasitic resistance that results from the various circuitry within the MTJ memory cell 602, such as from bit-lines, word lines, and CMOS circuitry for activating an individual memory cell. In addition, the amount of parasitic resistance associated with a particular memory cell of interest within the MTJ bit cell array 602 varies with the location of the memory cell of interest within the MTJ bit cell array 602.

The circuitry 600 has a plurality of switches labeled SW1 and another plurality of switches labeled SW2. In order to test a given memory element in the MTJ bit cell array 602 a signal is read from the particular memory cell of bit cell array 602 and from a corresponding memory cell in the reference bit cell array 604. This task is performed with all of the switches labeled SW1 closed and switches labeled SW2 open, which causes the reference cell 606 to be bypassed. The reference from the MTJ bit cell array 602 includes the resistance of the tested memory cell and also includes the parasitic resistance of the bit cell array 602 associated with that particular memory cell. Similarly, the signal read from the reference bit cell 604 includes the resistance of the corresponding memory cell located in a similar location or mirror location within the reference bit cell array 604, as well as the associated parasitic resistance of associated reference memory cell. The signals from the MTJ bit cell array 602 and the reference bit cell array should be generally similar, since they are manufactured in a common manufacturing process and have similar locations within the memory arrays 602, 604. However, because the measured resistance from the memory cell of the array 602 and memory cell of reference cell array 604 both include the parasitic resistance of various circuitry of these arrays, the resistance of the memory cell alone cannot at this point be determined.

With continued reference to FIG. 6, the switches denoted as SW1 are opened and the switches denoted as SW2 are closed. At this point the resistance from the memory cell of interest from array 602 and resistance of the associated memory cell of array 604 are again read. However, at this point, the electrical resistance from memory cell 604 includes the additional reference resistor 606. The reference resistor 606 is configured to have a resistance that is equal to the desired resistance of a functioning memory MTJ memory cell. By determining the resistance with and without the reference resistor, the parasitic resistance can be determined. Then, the actual resistance of the tested memory cell from the array 602 can be determined as the total resistance from memory cell 602 minus the parasitic resistance, or resistance of the tested memory cell=(bit line voltage/total current)-(bit line voltage/parasitic current).

With continued reference to FIG. 6, the circuitry 600 and it's function will be described in greater detail. The reference side of circuitry 600 includes an op-amp 608, which is part of a voltage follower circuit 610. A bit line voltage vbl-F is input to the op-amp 608 of the voltage follower circuit 610. Similarly, the SA side of the circuitry 600 includes a voltage follower circuit 612 including an op-amp 614. A bit line voltage is fed to the op-amp 614 of the voltage follower circuit 612. In addition, the circuitry 600 includes a plurality of current mirror circuits 616, 618, 620.

A voltage Vdd can be supplied to the circuitry 600 at locations as shown. The voltage Vdd is a voltage that is sufficiently high to switch the magnetic state of a magnetic memory cell in the arrays 602, 604. A voltage/current from the MTJ bit cell array can be sent to an AMP meter at a DQ pad. The voltage and current sent to the AMP meter at the DQ pad can be used to determine the electrical resistance of the memory cell of interest within the array 602 plus any parasitic resistance associated with that particular memory cell. Similarly, an electrical voltage and current from the reference bit cell array 604 can be sent to an amp meter through line 624. Based on the voltage and current delivered to the AMP meter through line 624, the electrical resistance of a particular memory cell within the reference bit cell array 604 and associated parasitic resistance can be determined. This resistance may or may not include the resistance of the reference resistor 606 depending upon the state of switch SW1 located in parallel with the reference resistor 606.

In order to accurately determine an electrical resistance of the memory cell and associated parasitic resistance of arrays 602, 604, the current through the circuitry 600 should be controlled so that a change in electrical voltage can accurately reflect the associated electrical resistance. The presence of the voltage follower circuitry 610, 612 can provide the desired bit line voltage without affecting the current through the circuitry 600. The current mirror circuitry 616, 618, 620 controls the electrical current through the circuitry 600 even when the resistance through the circuitry changes, such as from changing memory cell resistance, parasitic resistance and varied states of switches SW1, SW2 (affecting whether resistor 606 is included in the measurement).

Figure 7:
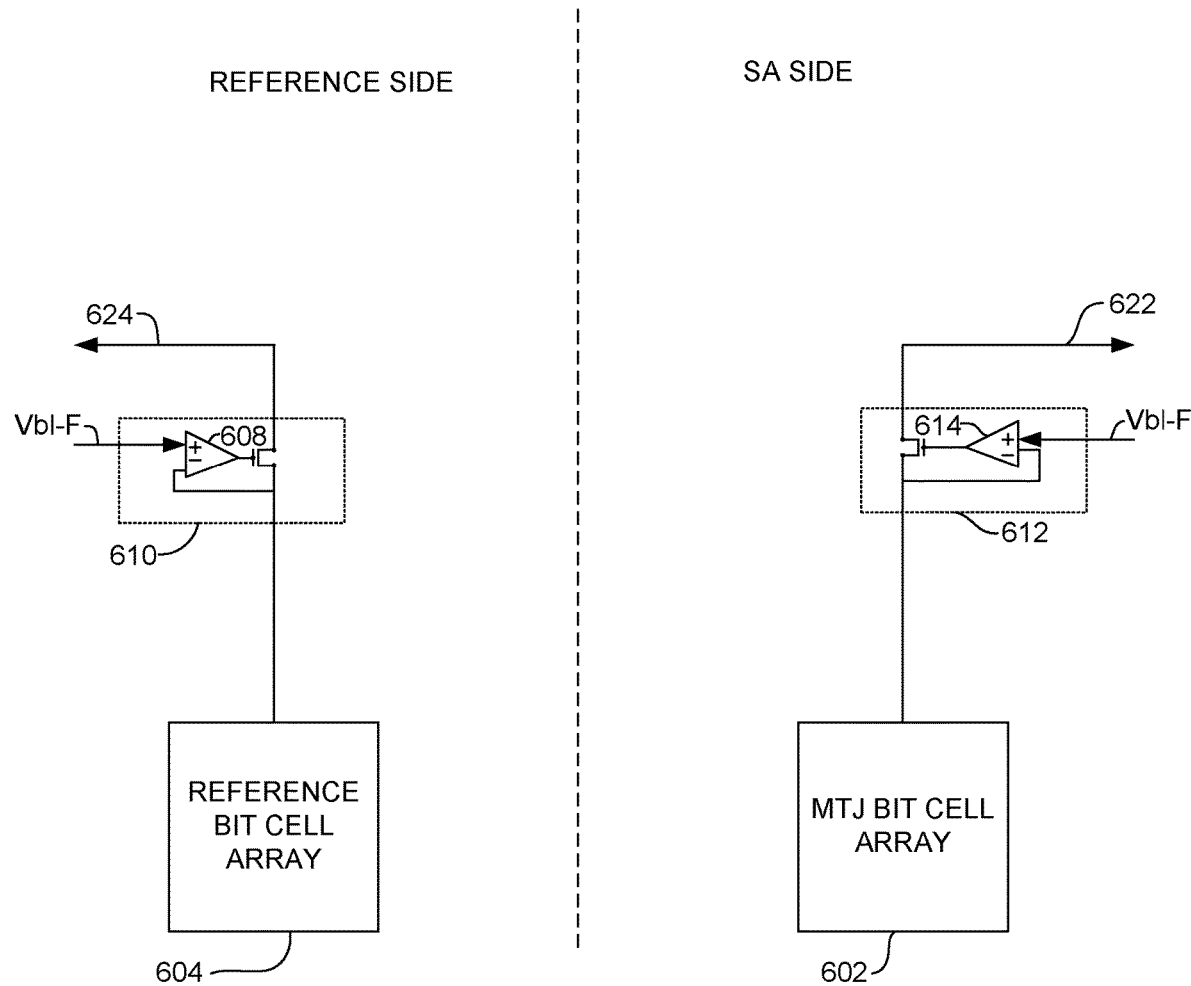
FIG. 7 is a schematic showing the circuitry of FIG. 6 in a first switched configuration.
Figure 8:
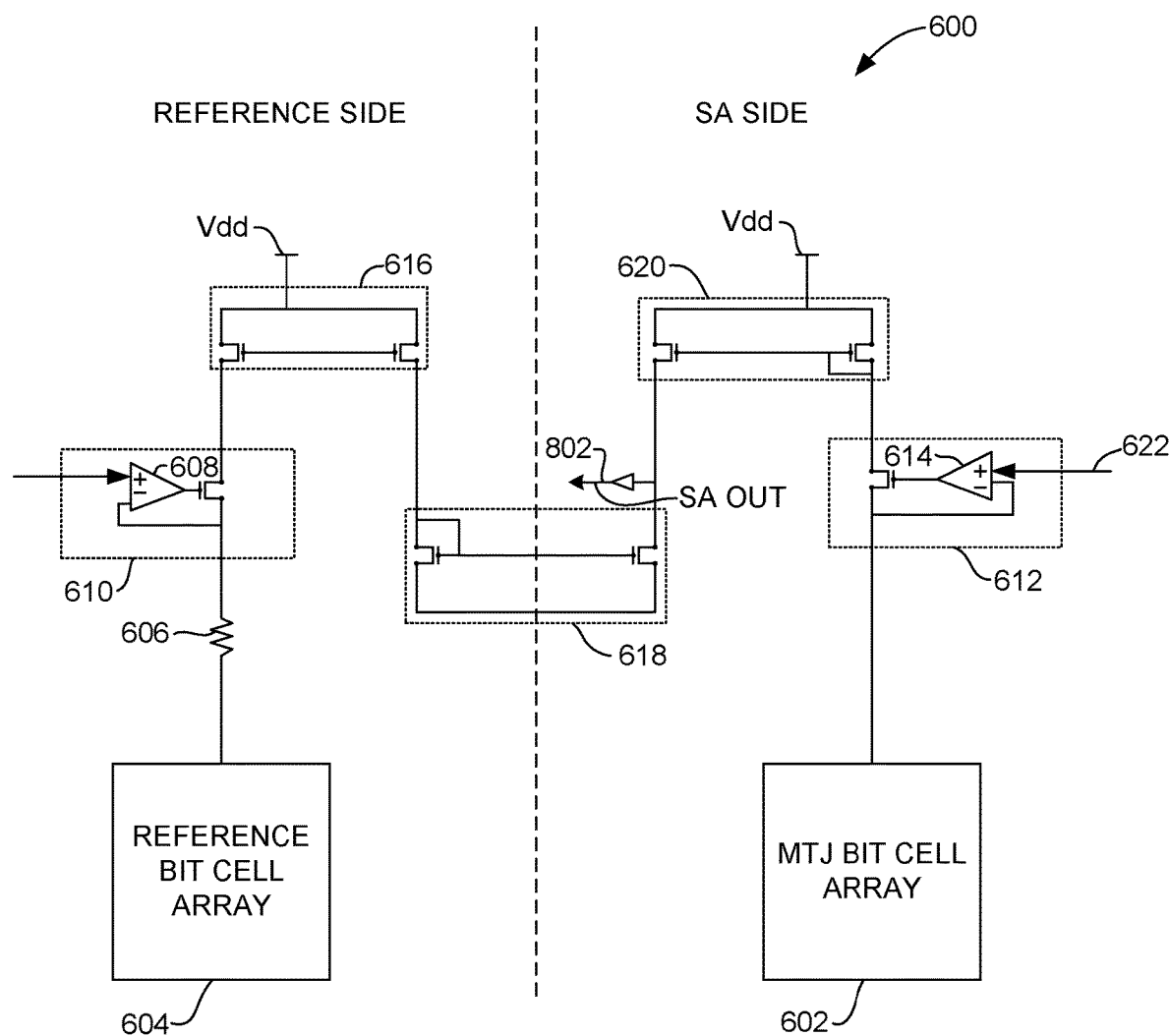
FIG. 8 is a schematic showing the circuitry of FIG. 6 in a second switched configuration.

FIG. 7 shows the circuitry 600 as configured with all of the switches SW1 closed and all of the switches SW2 open. FIG. 8 shows the circuitry 600 with switches SW1 open and SW2 closed. With switches SW1 closed and SW2 open as shown in FIG. 7, a signal from a particular magnetic memory cell can be read from the MTJ bit cell array 602. This signal can be read at an AMP meter DQ pad through line 622. Similarly, a signal from a corresponding memory cell of the reference bit cell array 604. This reference bit cell signal can be read at an AMP meter pad through line 624. The signals can be compared to determine whether there is a difference between the reference cell resistance (from array 604) and the bit MTJ memory cell from the array 602.

Then, with reference to FIG. 8, with switches SW1 closed and SW2 open, the signal from the arrays 602, 604 are read at an output line 802. This signal will include the resistance of the memory cells of both arrays 602, 604 and will also include the resistance of the reference resistor 606 which has a known value that is equivalent to a desired resistance of a functioning MTJ memory cell. By comparing the signals obtained from the switch configuration of FIG. 7, with the signal from the switch configuration of FIG. 8, the amount of parasitic resistance associated with the tested memory cell can be determined and subtracted out to determine the actual electrical resistance of the tested MTJ memory cell. As discussed above, the resistance from each signal can be determined by Ohms law as R=V/I. Because the current I is controlled by the voltage follower and current mirror circuitry as discussed above, the change in voltage can be used to determine the resistance from the various measured signals.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments but should be defined only in accordance with the following claims and their equivalents.

What is claimed is:

1. A magnetic memory device, comprising:
   a magnetic bit cell array including a first plurality of magnetic tunnel junction elements;
   a reference bit cell array including a second plurality of magnetic tunnel junction elements;

circuitry connected with the bit cell array and the reference bit cell array, the circuitry being configured to:

read a signal from the bit cell array to determine an electrical resistance associated with first magnetic tunnel junction element that is one of the first plurality of magnetic tunnel junction elements;

read a signal from the reference bit cell array to determine an electrical resistance associated with a second magnetic tunnel junction element that is one of the second plurality of magnetic tunnel junction elements;

determine a parasitic resistance associated with the first magnetic tunnel junction element to determine an electrical resistance of the first magnetic tunnel junction element without the parasitic resistance, and comparing the resistance of the first magnetic tunnel junction element with a reference value; wherein the circuitry includes one or more switches for switching between a first configuration wherein individual signals are read from each of the bit cell array and reference bit cell array and a second configuration wherein signals from the bit cell array and reference bit cell array are combined and further include a resistance from a reference resistor.

2. The magnetic memory device as in claim 1, wherein the circuitry further includes a reference resistor, and wherein the comparison of the electrical resistance of the first magnetic tunnel junction element with a reference value further comprises comparing the electrical resistance of the first magnetic tunnel junction element with an electrical resistance of the reference resistor.

3. The magnetic memory device as in claim 1 wherein the bit cell array and the reference bit cell array are similar to one another.

4. The magnetic memory device as in claim 1, wherein the bit cell array and the reference bit cell each include a common layout of memory elements and associated circuitry manufactured in a common manufacturing process.

5. The magnetic memory device as in claim 1, wherein the second magnetic tunnel junction element is located in a similar location within the reference bit cell array to that in which the first magnetic tunnel junction element is located within the bit cell array.

6. The magnetic memory device as in claim 1, wherein the circuitry includes a reference resistor and at least a switch connected in parallel with the resistor.

7. The magnetic memory device as in claim 1, wherein the circuitry includes at least one current mirror.

8. The magnetic memory device as in claim 1, wherein the circuitry includes a voltage follower circuit connected with a bit line.

9. The magnetic memory device as in claim 1, wherein the circuitry includes a first voltage follower circuit configured to provide a bit line voltage to the MTJ bit cell array and a second voltage follower circuit configured to provide a bit line voltage to the reference bit cell array.

10. A magnetic memory device, comprising:
a magnetic bit cell array including a first plurality of magnetic tunnel junction elements;
a reference bit cell array including a second plurality of magnetic tunnel junction elements;
circuitry connected with the bit cell array and the reference bit cell array, the circuitry being configured to:

read a signal from the bit cell array to determine an electrical resistance associated with first magnetic tunnel junction element that is one of the first plurality of magnetic tunnel junction elements;

read a signal from the reference bit cell array to determine an electrical resistance associated with a second magnetic tunnel junction element that is one of the second plurality of magnetic tunnel junction elements;

determine a parasitic resistance associated with the first magnetic tunnel junction element to determine an electrical resistance of the first magnetic tunnel junction element without the parasitic resistance, and comparing the resistance of the first magnetic tunnel junction element with a reference value;

wherein the circuitry is configured to maintain a desired electrical current at varying voltages and resistances.

11. A method for testing magnetic memory elements in a magnetic random access memory array, the method comprising:

providing a bit cell array, a reference bit cell array and circuitry connected with the bit cell array and reference bit cell array;

configuring the circuitry in a first configuration;

performing a first reading process with the circuitry in the first configuration to read a current and a voltage separately from each of the bit cell array and the reference bit cell array to determine an electrical resistance associated with a particular memory cell of the bit cell array and a corresponding memory cell of the reference bit cell array;

configuring the circuitry in a second configuration;

performing a second reading process with the circuitry in the second configuration to read a combined current and voltage from the bit cell array and the reference bit cell array, the circuitry being configured to include an electrical resistance from a reference resistor; and determining a parasitic resistance value associated with the particular memory cell of the bit cell array based on the results of the first and second reading process and also determining an electrical resistance of the particular memory cell excluding the parasitic resistance.

12. The method as in claim 11, wherein further comprising comparing the electrical resistance value associated with the particular memory cell excluding the parasitic resistance with a reference resistance value to determine whether the resistance of the particular memory cell excluding the parasitic resistance is within acceptable parameters.

13. The method as in claim 12, further comprising repeating the process for a different particular memory cell in the bit cell array and for a different corresponding memory cell of the reference bit cell array.

14. The method as in claim 11, wherein the circuitry includes a plurality of switches for switching between the first and second configurations.

15. The method as in claim 11, wherein the circuitry includes a voltage follower circuit for applying a bit line voltage to each of the bit cell array and the reference bit cell array.

16. The method as in claim 11 further comprising current mirror circuitry for controlling current flow through the circuitry when it is in the second configuration.

* * * * *